United States Patent [19]

Yamakawa

[11] Patent Number: 4,978,843
[45] Date of Patent: Dec. 18, 1990

[54] PHOTOELECTRIC SENSOR HAVING A FOLDED LIGHT PATH

[75] Inventor: Masami Yamakawa, Tokyo, Japan
[73] Assignee: Aisens Co., Ltd., Japan
[21] Appl. No.: 381,968
[22] Filed: Jul. 18, 1989
[30] Foreign Application Priority Data Sep. 10, 1988 [JP] Japan .................. 63-119083[U]

[51] Int. Cl.⁵ .................................................. H01J 3/14
[52] U.S. Cl. ...................................... 250/216; 350/444
[58] Field of Search ................ 250/216, 239; 350/442, 350/444–446

[56] References Cited

U.S. PATENT DOCUMENTS

| | | | |
|---|---|---|---|
| 4,554,448 | 11/1985 | Sillitto | 250/216 |
| 4,566,763 | 1/1986 | Greguss | 350/444 |
| 4,880,974 | 11/1989 | Yamakawa | 250/239 |

Primary Examiner—David C. Nelms
Assistant Examiner—Khaled Shami
Attorney, Agent, or Firm—Barry R. Lipsitz

[57] ABSTRACT

A photoelectric sensor comprises a thin plate-shaped optical body, a circuit block and a tubular casing for incorporating therein the optical body and the circuit block. A signal light incoming through a transparent protector of the casing is reflected upon a first reflective mirror of the optical body. Following this first reflection, a second reflection is made upon a second reflective mirror thereof. The light having passed through a light collecting lens is received by a photoelectric converting element and converted into electric signals for output. Since the optical body comprises a plurality of reflective surfaces, an optical path up to the photoelectric converting element can be incorporated compactly within the thin plate-shaped optical body.

13 Claims, 10 Drawing Sheets

FIG. 6
FIG. 7
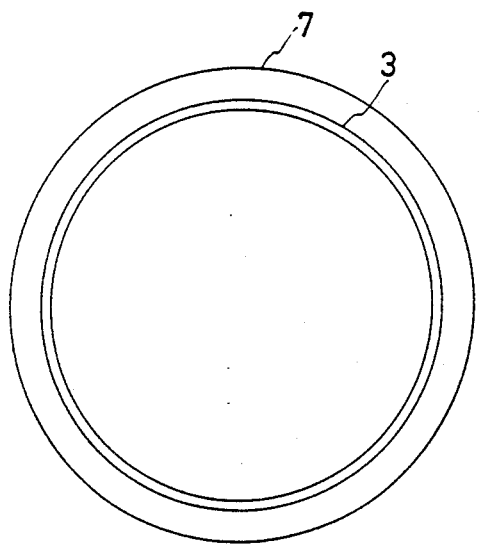
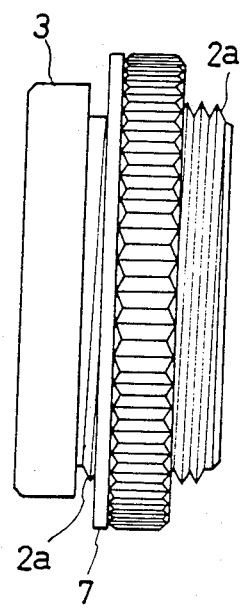

F I G. 13
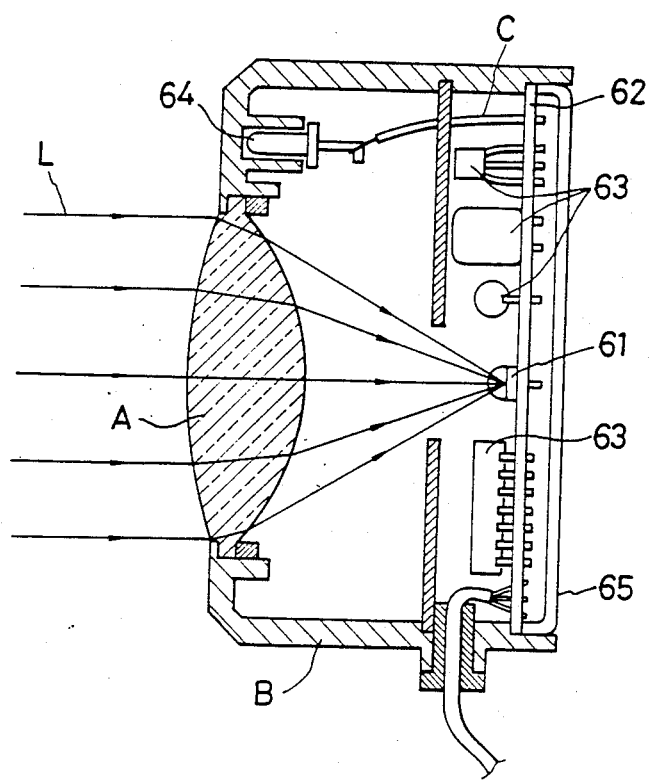
(PRIOR ART)

PHOTOELECTRIC SENSOR HAVING A FOLDED LIGHT PATH

TECHNICAL FIELD

This invention relates to a photoelectric sensor comprising a light collecting system and a light receiving system.

BACKGROUND OF THE INVENTION

The photoelectric sensor enables a non-contact detection of persons or objects, so that it is used to detect any objects to be conveyed in various automated machines or conveyer lines, and any person's approach to an automatic door or the like.

In FIG. 13 there is shown a section view of a conventional photoelectric sensor wherein a convex lens is fixed in a circular opening formed on a front side of a casing. Disposed on a focal point of the convex lens is a photoelectric element comprising a light emitting element such as a light emitting diode and a light receiving element such as a phototransistor. Fixed upon an inner surface of a casing are a light driving circuit, a signal amplifying circuit, an operation indicating lamp, a variable resistor and other parts so as to hinder an optical path between the convex lens and the photoelectric element. All of the aforesaid components are electrically connected to each other. An electric wire connected to an input terminal and an output terminal is connected to a device outside the casing.

Referring to FIG. 13, symbol A is a convex lens for light collection which is disposed on a front side of a casing B. Numeral 61 is a photoelectric element disposed on a focal point of the convex lens A. Numeral 62 is a wiring substrate, numeral 63 are a plurality of electronic parts disposed upon the wiring substrate 62 and numeral 64 is an operation indicating lamp. Such a photoelectric sensor can be installed on a certain place by means of brackets and screws.

In recent years, the structure of the photoelectric sensor has become more small-sized and more compact to meet users' requirements. Yet there are the following problems hindering the manufacture of a small-sized photoelectric sensor.

Firstly, when disposing necessary parts upon the inner wall of the casing of the photoelectric sensor, an assembler is forced to insert such tools as a driver, pincettes, soldering tool or the like into the interior of the casing. Accordingly, as the casing becomes smaller, assembling becomes more cumbersome. Thus, to make the photoelectric sensor smaller is contradictory to a better efficiency of assembling.

Secondly, since a convex lens is adapted for a light collecting means, a conically enlarged space must be formed in an optical path toward the photoelectric converting element. More particularly, in order to enhance the performance of the photoelectric sensor, it is desirable to increase the light incoming volume by enlarging a caliber of the convex lens and to minimize the influence of any outer disturbing light by extending a focal distance of the convex lens.

Therefore, it is necessary to dispose a lens having a larger caliber and a longer focal distance, so that a larger conical space must be formed. In this regard, to make the photoelectric sensor smaller is contradictory to the improvement of optical properties.

Further, one of the defects of the conventional photoelectric sensor is that it is inconvenient to handle. Since it is large-sized, it is easily touched by persons or objects, thereby an optical axis is biassed and it causes malfunction. Finally, when some dust or oily matter stucks to a body of the photoelectric sensor, cleaning is not easy.

Still further, when starting an inverter motor, the photoelectric converting element is provided with a metal evaporative plating thereupon in order to prevent any errors in operation that may be caused by electromagnetic radiating noises due to a magnet switching. This causes the light transmission rate to deteriorate.

In view of the foregoing problems, this invention has been attained. It is therefore a general object of the invention to provide a compact photoelectric sensor which brings a good fabricability, a super optical performance and a suitable operability, and is free from any influence of electromagnetic radiating noises.

DISCLOSURE OF THE INVENTION

The photoelectric sensor according to this invention comprises:

a transparent optical body of a semicrescent-shaped section having a circular flattened objective surface as a front surface and a circular convex surface as a rear surface;

a circuit block behind the transparent optical body;

a tubular casing having an opening side and incorporating the optical body and the circuit block therein;

a transparent protector fitted on the opening side of the casing;

a lock nut to be engaged with an outer circumference of the casing;

the optical body being, on a central part of the front surface, provided with a first recess having about one-third diameter of the front surface, while being, on a central part of the rear surface, provided with a second recess forming a light collecting lens opposed to a photoelectric converting element;

a concave bottom of the first recess being formed as a second reflective mirror by a vacuum evaporating plating means;

a surface other than said second recess of the rear surface being formed as a first reflective mirror by a vacuum evaporating plating means, and a periphery of the rear surface having a skirt member and the first reflective mirror being provided with a light collecting lens for transmitting a luminous flux;

the circuit block being, on its front surface, provided with the photoelectric converting element and an operation indicating lamp and, on its front and rear surface, provided with a plurality of electronic parts, and a periphery of said circuit block being directed to the skirt member.

BRIEF DESCRIPTION OF DRAWINGS

FIGS. 1 to 4 show a first embodiment of a photoelectric sensor according to this invention, which covers the appended claims 1 to 3. FIG. 1 is a vertical section view of the photoelectric sensor. FIG. 2 is a front view thereof. FIG. 3 is a side view thereof.

FIGS. 5 to 7 show a second embodiment of a photoelectric sensor according to this invention, which covers the appended claim 4. FIG. 5 is a vertical section view of the photoelectric sensor. FIG. 6 is a front view thereof. FIG. 7 is a side view thereof.

FIGS. 8 to 12 show a third embodiment of a photoelectric sensor according to this invention, which covers the appended claims 5 to 8. FIG. 8 is a vertical section view of the photoelectric sensor. FIG. 9 is a front view thereof. FIG. 10 is a side view thereof. FIG. 11 is a rear view thereof.

FIG. 13 is a vertical section view of a conventional photoelectric sensor.

FIGS. 14(a) to 14(c) show an embodiment of an optical body of this invention, which covers the appended claims 9 to 13, in which FIG. 14(a) is a front view, FIG. 14(b) is a section view taken on line 14b—14b in FIG. 14(c) and FIG. 14(c) is a rear view.

THE BEST MODE FOR CARRYING OUT THE INVENTION

Figure 1:
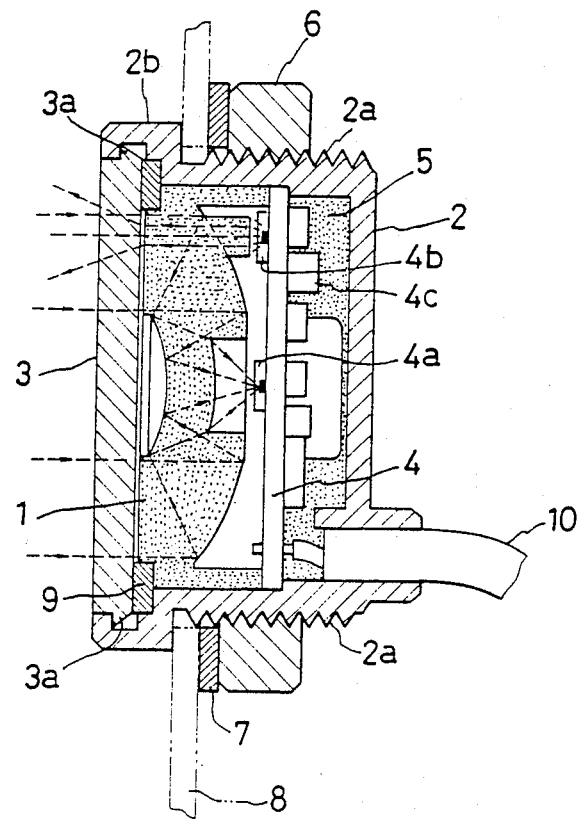
Figure 2:
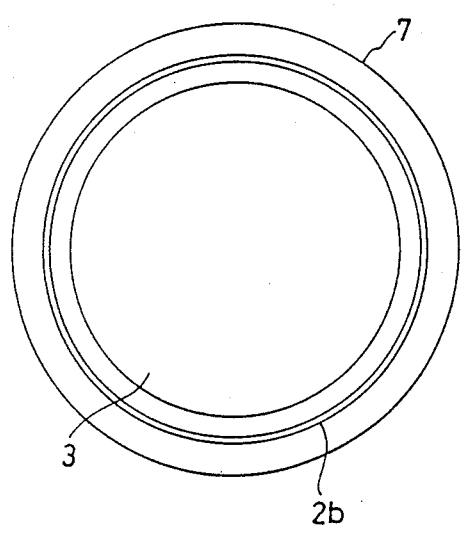
Figure 3:
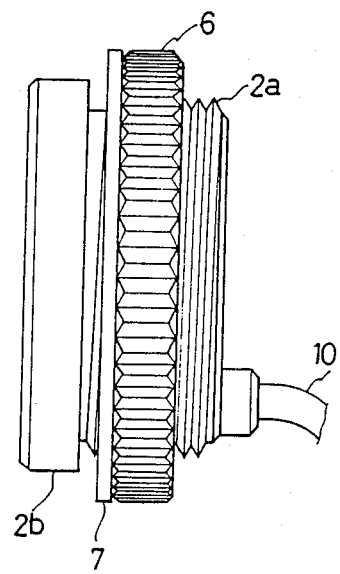

Preferred embodiments of this invention will now be described with reference to the accompanying drawings. FIGS. 1 to 4 show a first embodiment according to the appended claims 1 to 3 of this invention.

Numeral 1 is a transparent resinous optical body having a thin plate shape. Numeral 2 is a resinous casing having an opening side. An outer surface of the casing 2 is provided with a screw thread portion 2a. Numeral 2b is a ring-shaped stopper integrally fixed with the casing 2 and formed immediately behind an objective surface. The stopper 2b is, on its inner surface, provided with a groove to insert therein a locking nail 3a of a transparent resinous protector 3. The protector 3 is a disc type, which is disposed in the opening of the casing 2.

Numeral 4 is a circuit block which is disposed so as to oppose to a rear surface of the optical body 1. Mounted upon a surface opposed to the optical body 1 are a photoelectric converting element 4a and an operation indicating lamp 4b, while mounted upon a rear surface of the optical body 1 are a plurality of electronic parts 4c.

Numeral 5 is an epoxy resinous material filled between the circuit block 4 and the bottom of the casing 2 to protect the circuit block from water, shaking and humidity. Numeral 6 is a lock nut engageable with a screw thread portion 2a. The photoelectric sensor is fixed on a panel 8 which is clamped between the stopper 2b, a rubber washer 7 and the lock nut 6. Numeral 9 is an annular rubber packing which is inserted between the protector 3 and the casing 2. Numeral 10 is a lead wire for input/output to be connected to the circuit block 4.

The construction of the optical body 1 will now be described in connection with FIGS. 4(a), 4(b), 4(c) and 4(d).

The transparent resinous optical body 1 has a semicrescent-shaped section and a diameter of 20 mm. Numeral 21 is a circular flattened objective surface which is formed toward an object to be detected. (The objective surface 21 has a diameter of 18 mm.).

When detecting any object existing within about 1 meter distant therefrom, the objective surface 21 is preferably formed as a gently convex surface.

Numeral 31 is a circular convex surface having a diameter of 18 mm (R=13.4 mm, aspherical). The circular convex surface 31 is opposed immediately to a photoelectric converting element 4a.

Figure 4A:
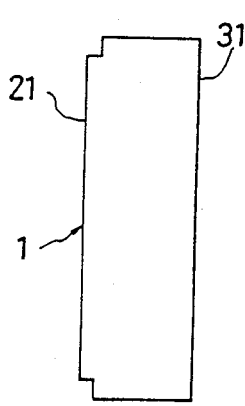
FIG. 4(a) is a side view of an optical body.
Figure 4B:
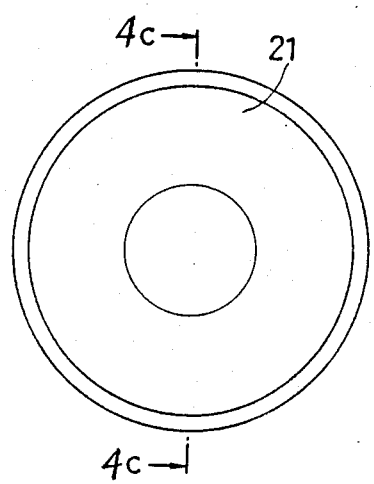
FIG. 4(b) is a front view thereof.
Figure 4C:
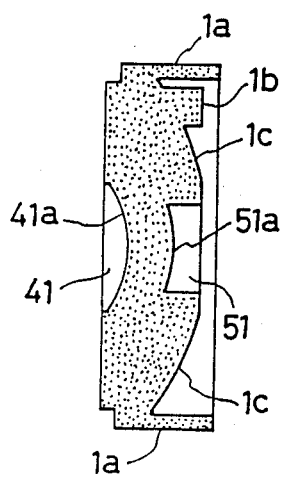
FIG. 4(c) is a section view taken along line 4c—4c in FIG. 4(b).
Figure 4D:
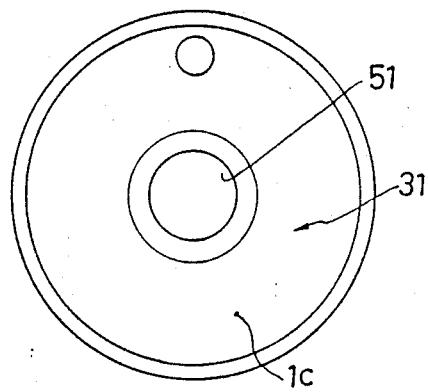
FIG. 4(d) is a rear view thereof.

As illustrated clearly in FIGS. 4(b) and 4(c), formed upon a central part of the objective surface 21 is a first recess 41 having a concave surface of a diameter of 7 mm (R=7.7 mm) which is nearly equivalent to one-third of the circular convex surface 31.

Further, the first recess 41 is, upon its concave bottom surface, provided with a second reflective surface 41a which is formed by a vacuum evaporating plating process. Numeral 51 is a second recess formed on a central part of the circular convex surface 31 so as to oppose to the first recess 41. A convex bottom surface of the second recess 51 has a slightly smaller diameter than a bottom surface of the first recess 41. The ratio of the two bottom surfaces is 15:1. The convex surface of the second recess 51 constitutes a light collecting lens 51a. The photoelectric converting element 4a of the circuit block 4 is directly faced or fitted to the second recess 51.

Numeral 1a is a skirt (about 3 mm in height) formed upon a circumference of the circular convex surface 31. Numeral 1b is an opening formed on the circular convex surface 31 in order to radiate a luminous flux of the operation indicating lamp 4b through the objective surface 21. The opening 1b has a convex bottom surface. Alternatively, it may be formed as a Fresnel surface. Then, the radiated light becomes a parallel one that is visible from a far distance.

Numeral 1c is a first reflective surface formed upon the circular convex surface 31 by means of a vacuum evaporating plating process. According to this embodiment, the photoelectric sensor has an outer diameter of 20 mm and a thickness of about 14 mm.

An operation of this embodiment will be described. A signal light incoming from the circular objective surface 21 of the optical body 1 through the protector 3 is reflected upon the first reflective surface 1c and transferred to the second reflective surface 41a. Then, a second reflection occurs. Due to this second reflection, the light passing light collecting lens 51 is collected upon the photoelectric converting element 4a, and converted into electric signals for output. Any variation of the incoming light volume is immediately converted electric signals, so that any persons or objects existing in an optical path before the protector 3 or the objective surface 21 are detected.

Since the optical body 1 comprises the first reflective surface 1c and the second reflective surface 41a, an optical path to the photoelectric converting element 4a from a circular objective surface of the convex lens A as shown in a conventional photoelectric sensor in FIG. 13 can be formed compactly in a folded state within the thin plate-shaped optical body 1. The light from the operation indicating lamp 4b as a light emitting diode is radiated to the objective surface 21 of the optical body 1 through the light collecting lens means 9.

Most of the electromagnetic noises are intercepted by the metal coating formed on the first reflective surface 1c and the second reflective surface 41a, and thereby a plurality of electronic parts 4c on the circuit block 4 can be operated without error. Thus, both the first reflective surface 1c and the second reflective surface 41a have the function of preventing the electromagnetic radiating noises. The metal coating (not illustrated) is electrically connected to a ground of a power source.

Figure 5:
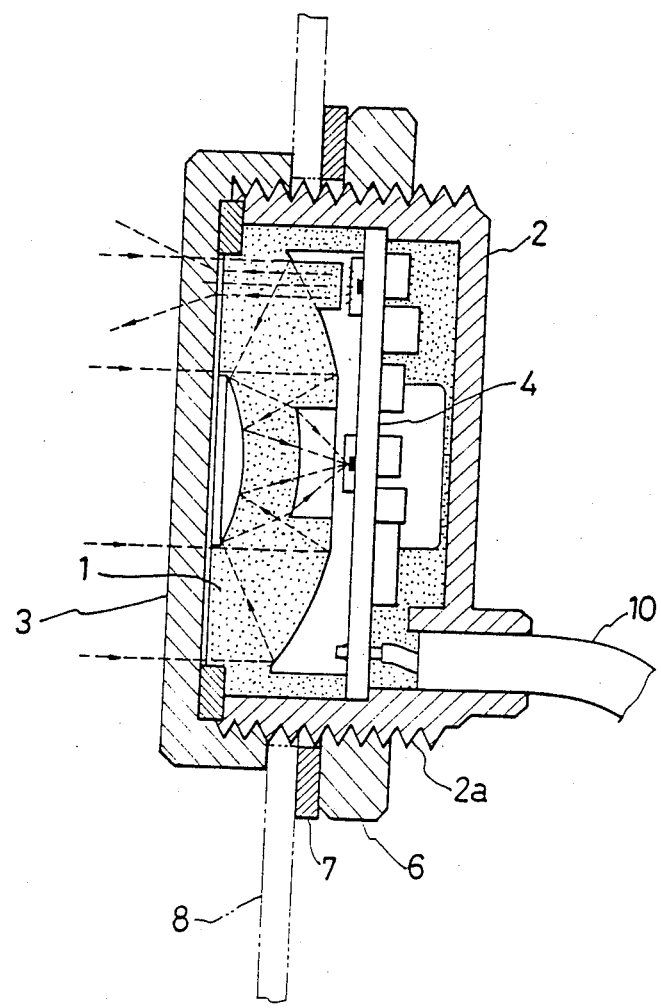

A second embodiment of this invention according to the appended claim 4 will be described in connection with FIGS. 5, 6 and 7.

Since the components in the second embodiment have the same numerals as the first embodiment, their description will be omitted. In the second embodiment, the construction of the casing 2 and the protector 3 slightly differs from that in the first embodiment, and the other construction is the same as the first one.

In this embodiment, the whole circumference of the casing 2 is provided with the screw thread portion 2a, but not provided with the stopper 2b. The protector 3 is of a shallow casing type, and its bottom surface is opposed to the objective surface 21 of the optical body 1. The protector 3 is, on its inner circumference, provided with an inner screw thread portion to be engaged with the screw thread portion 2a of the casing. A mounting panel 8 is supported through the washer 7 between a side edge of the protector 3 and the lock nut 6.

The function and effects of the second embodiment are the same as those of the first embodiment. In the second embodiment, mounting of the protector 3 in the casing 2 is easier than the first embodiment.

A third embodiment of this invention according to the appended claims 5 to 8 will be described in connection with FIGS. 8 to 12. Since some of the components in the third embodiment have the same numerals as the previous embodiments, their description will be omitted.

Figure 8:
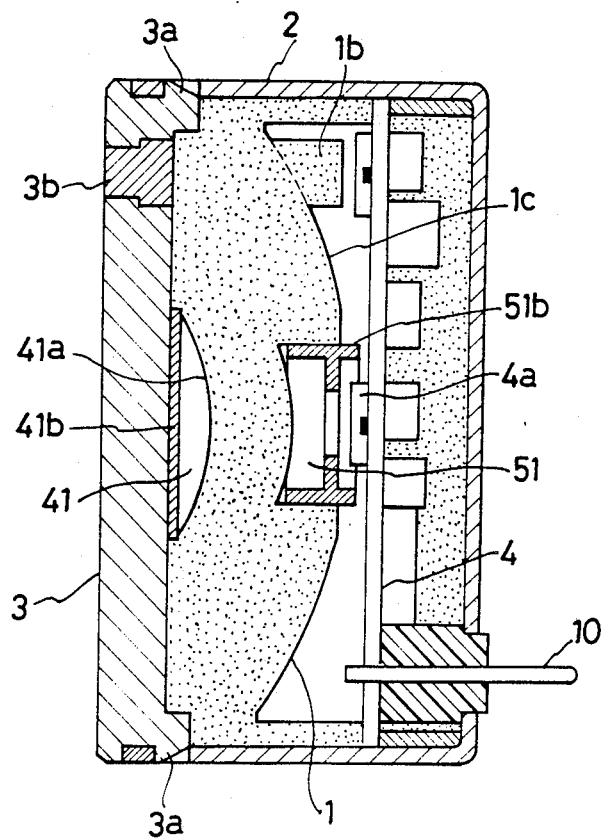
Figures 9, 10:
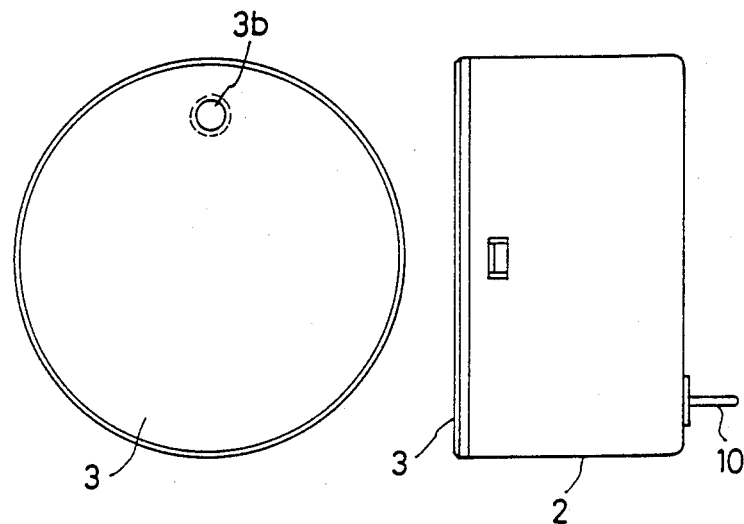
Figure 11:
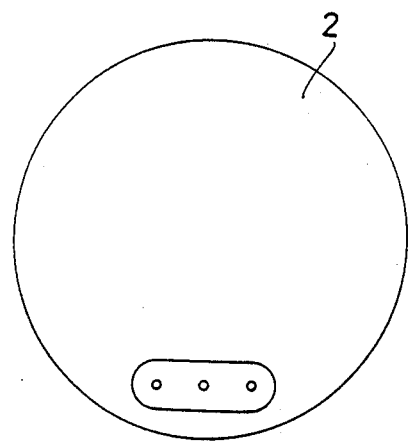
Figure 12A:
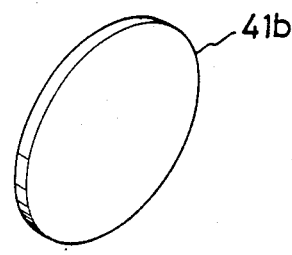
FIGS. 12(a) and 12(b) respectively are a perspective view of a first shielding member and of a second shielding member.
Figure 12B:
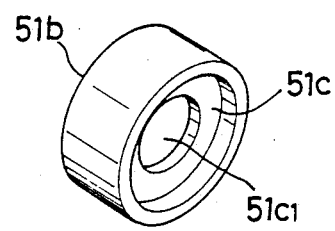

Referring to FIG. 8, the casing 2 having one opening side is made of a transparent material capable of cutting any visible light. Inserted in a position opposed to the convex portion 1b of the optical body 1 is an indicating light transmitting member 3b of the optical body 1.

Numeral 41b is a first shielding metal disc on the opening of the first recess 41 of the optical body 1, while numeral 51b is a second shielding metal member fitted in the second recess 51. As clearly illustrated in FIG. 12, the first shielding metal disc 41b is a circular one, while the second shielding metal member 51b is of a cylindrical shape, which has a shielding disc 51c having an aperture 51c1. The light is passed through the aperture 51c1.

Due to the second metal member 51b the circuit block 4 is not affected by any electromagnetic radiating noises from a backward and sideward direction. Further, the electromagnetic radiating noises from a front direction are shielded effectively by the first shielding disc 41b, while those from an obliquely forward direction are shielded by the second metal member 51b. The photoelectric sensor according to this embodiment is suitable for various devices that are used in the plants where the electromagnetic radiating noises are fully filled.

Figure 14:
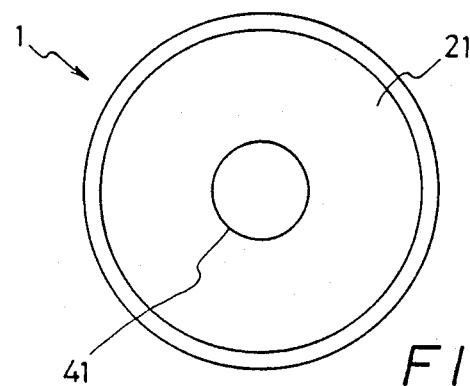
Figure 14:
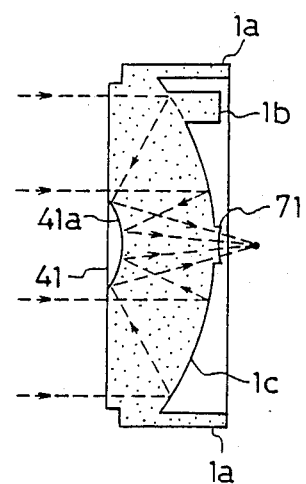
Figure 14:
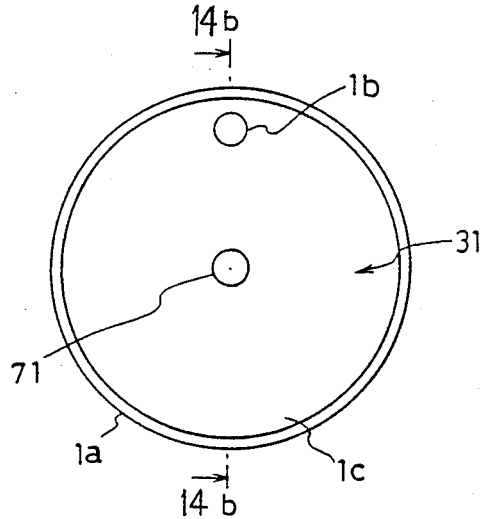

An embodiment of the optical body of this invention according to the appended claims 9 to 13 will be described in connection with FIGS. 14(a), 14(b) and 14(c). In this embodiment, the optical body has a novel structure, and the other structure is the same as the aforesaid invention.

Numeral 71 is a circular protrusion as a light collecting lens which is integrally formed on the rear surface 31 of the optical body 1. The circular protrusion 71 is, upon a surface opposing to the photoelectric element 4a, provided with a concave shape. The diameter of the optical body is 20 mm like the one in FIGS. 14(a) to 14(c). The diameter of the first recess 41 is 5.3 mm and the curvature of the concave surface 41a thereof is R=6.1 mm. The diameter of the circular protrusion 71 is 2 mm, and the curvature of the concave surface thereof is R=7.7 mm. The curvature of the rear surface 31 is aspherical and R=15 mm.

The optical body 71 in this embodiment has a long focal distance. Accordingly, the photoelectric sensor according to this embodiment is suitable for the case when a plurality of photoelectric sensors are disposed in parallel with each other without any interference of the case for a long distance detection.

As discussed above, any cumbersome manual assembling such as insertion of components into a narrow interior of the casing has completely been removed, so that the photoelectric sensor according to this invention can be mass-produced by means of various robot machines. Thus, the manufacturing cost can be reduced greatly.

Further, a conical space upon an optical path is incorporated compactly in the interior of the optical body of a semi-crescent-shaped section. Thus, the optical body is formed very thin and small-sized. For example, its thickness is as small as about one-third of a conventional optical body.

Accordingly, such a small-sized photoelectric sensor according to this invention can be mounted simply on any wall in factories, offices, shops or houses without injuring any aesthetic appearance of surroundings.

Further, since the caliber of the optical body is larger and its focal distance is long, the light incoming volume is increased and any outer disturbing light is not influential. Accordingly, when one photoelectric sensor having the function of a light transmitting device is opposed to another photoelectric sensor having the function of a light receiving device, it is possible to extend its opposing distance greatly.

Further, when the photoelectric sensor is of a reflective type, it is possible to extend a distance between the photoelectric sensor and an object to be detected, and to make its detection easier. Still further, the present photoelectric sensor enables a very accurate detection by shielding any outer electromagnetic radiating noises.

What is claimed is:

1. A photoelectric sensor comprising:
  a transparent optical body of a semicrescent-shaped section having a circular flattened objective surface as a front surface and a circular convex surface as a rear surface;
  a circuit block behind said transparent optical body;
  a tubular casing having an opening side and incorporating said optical body and said circuit block therein;
  a transparent protector fitted on the opening side of said casing;
  a lock nut to be engaged with an outer circumference of said casing;
  said optical body being, on a central part of said front surface, provided with a first continuous concave recess having about one-third diameter of said front surface, while being, on a central part of said rear surface, provided with a second recess having a convex bottom and a smaller diameter than said first recess, said second recess forming a light collecting lens opposed to a photoelectric converting element;
  a concave bottom of said first recess being formed as a second reflective mirror by a vacuum evaporating plating means;
  a surface other than said second recess of said rear surface being formed as a first reflective mirror by a vacuum evaporating plating means, and a periphery of said rear surface having a skirt member and said first reflective mirror being provided with a light collecting means for transmitting a luminous flux; and said circuit block being, on its front surface, with said photoelectric converting element and an operation indicating lamp and, on its front and rear surface, provided with a plurality of electronic parts, and a periphery of said circuit block being directed to said skirt member.

2. A photoelectric sensor as claimed in claim 1, in which said casing is, on its outer circumference, provided with a screw thread portion and a stopper engaged with a lock nut, thereby a mounting panel is supported between said lock nut and said stopper.

3. A photoelectric sensor as claimed in claim 1, in which a resinous material is filled in a space between a bottom of said casing and said circuit block.

4. A photoelectric sensor as claimed in claim 1, in which a periphery of said transparent protector is engaged with said screw thread portion of said casing.

5. A photoelectric sensor comprising:
a transparent optical body of a semicrescent-shaped section having a circular flattened objective surface as a front surface and a circular convex surface as a rear surface;
a circuit block behind said transparent optical body;
a tubular casing having an opening side and incorporating said optical body and said circuit block therein;
a transparent protector fitted on the opening side of said casing;
said optical body being, on a central part of said front surface, provided with a first continuous concave recess having about one-third diameter of said front surface, while being, on a central part of said rear surface, provided with a second recess having a convex bottom and a smaller diameter than said first recess, said second recess forming a light collecting lens opposed to a photoelectric converting element;
a concave bottom of said first recess being formed as a second reflective mirror by a vacuum evaporating plating means;
a surface other than said second recess of said rear surface being formed as a first reflective mirror by a vacuum evaporating plating means, and a periphery of said rear surface having a skirt member and said first reflective mirror being provided with a light collecting lens for transmitting a luminous flux; and
said circuit block being, on its front surface, with said photoelectric converting element and an operation indicating lamp and, on its front and rear surface, provided with a plurality of electronic parts, and a periphery of said circuit block being directed to said skirt member.

6. A photoelectric sensor as claimed in claim 5, in which said casing is made of a metal material, and a first shielding member and a second shielding member to shield any outer electromagnetic radiating noises are disposed in said first recess and said second recess respectively.

7. A photoelectric sensor as claimed in claim 6, in which said first shielding member is a circular metal disc to fitted in said first recess, while said second shielding member is a metal tubular body to be fitted in said second recess.

8. A photoelectric sensor as claimed in claim 7, in which said second shielding member comprises a circular metal plate comprises a circular metal plate having an aperture 9. A photoelectric sensor comprising:
a transparent optical body of a semicrescent-shaped section having a circular flattened objective surface as a front surface and a circular convex surface as a rear surface;
a circuit block behind said transparent optical body;
a tubular casing having an opening side and incorporating said optical body and said circuit block therein;
a transparent protector fitted on the opening side of said casing;
a lock nut to be engaged with an outer circumference of said casing;
said optic body being, on a central part of said front surface, provided with a first recess having about one-third diameter of said front surface;
said optical body being, on a central part of said rear surface, provided with a circular protrusion having a concave surface opposing to said first recess, thereby said circular protrusion forming a light collecting lens opposing to a photoelectric converting element;
a concave bottom of said first recess being formed as a second reflective mirror by a vacuum evaporating plating means;
a surface other than said circular protrusion of said rear surface being formed as a first reflective mirror by a vacuum evaporating plating means, and a periphery of said rear surface having a skirt member and said first reflective mirror being provided with a light collecting means for transmitting a luminous flux; and
said circuit block being, on its front surface, with said photoelectric converting element and an operation indicating lamp and, on its front and rear surface, provided with a plurality of electronic parts, and a periphery of said circuit block being directed to said skirt member.

10. A photoelectric sensor as claimed in claim 9, in which said casing is, on its outer circumference, provided with a screw thread portion and a stopper engaged with a lock nut, thereby a mounting panel is supported between said lock nut and said stopper.

11. A photoelectric sensor as claimed in claim 9, in which a resinous material is filled in a space between a bottom of said casing and said circuit block 12. A photoelectric sensor as claimed in claim 9, in which a periphery of said transparent protector is engaged with said screw thread portion of said casing.

13. A photoelectric sensor comprising:
a transparent optical body of a semicrescent-shaped section having a circular flattened objective surface as a front surface and a circular convex surface as a rear surface;
a circuit block behind said transparent optical body;
a tubular casing having an opening side and incorporating said optical body and said circuit block therein;
a transparent protector fitted on the opening side of said casing;
said optical body being, on a central part of said front surface, provided with a first recess having about one-third diameter of said front surface;

said optical body being, on a central part of said rear surface, provided with a circular protrusion having a concave surface opposing to said first recess, thereby forming said circular protrusion forming a light collecting lens opposing to a photoelectric converting element; forming a light collecting lens opposed to a photoelectric converting element;

a concave bottom of said first recess being formed as a second reflective mirror by a vacuum evaporating plating means;

a surface other than said circular protrusion of said rear surface being formed as a first reflective mirror by a vacuum evaporating plating means, and a periphery of said rear surface having a skirt member and said first reflective mirror being provided with a light collecting lens for transmitting a luminous flux; and said circuit block being, on its front surface, with said photoelectric converting element and an operation indicating lamp and, on its front and rear surface, provided with a plurality of electronic parts, and a periphery of said circuit block being directed to said skirt member.

* * * * *